US012656202B2

(12) United States Patent
Han et al.

(10) Patent No.: US 12,656,202 B2
(45) Date of Patent: Jun. 16, 2026

(54) SENSOR MODULE HAVING AN INTERMEDIATE PEDESTAL ON WHICH ONE OR MORE DIE ARE MOUNTED

(71) Applicant: Apple Inc., Cupertino, CA (US)

(72) Inventors: Caleb C. Han, San Jose, CA (US); Tongbi T. Jiang, Santa Clara, CA (US); Patrick E. O'Brien, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 531 days.

(21) Appl. No.: 18/125,649

(22) Filed: Mar. 23, 2023

(65) Prior Publication Data

US 2023/0384178 A1     Nov. 30, 2023

Related U.S. Application Data

(60) Provisional application No. 63/347,475, filed on May 31, 2022.

(51) Int. Cl.
| | |
|---|---|
| *G01L 19/14* | (2006.01) |
| *G01L 19/00* | (2006.01) |
| *H10W 90/00* | (2026.01) |

(52) U.S. Cl.
CPC .......... *G01L 19/147* (2013.01); *G01L 19/141* (2013.01); *G01L 19/148* (2013.01); *G01L 19/149* (2013.01); *G01L 2019/0053* (2013.01); *H10W 90/754* (2026.01)

(58) Field of Classification Search
None
See application file for complete search history.

(56) References Cited

U.S. PATENT DOCUMENTS

| | | | |
|---|---|---|---|
| 5,437,189 A | 8/1995 | Brown et al. |
| 6,401,545 B1 | 6/2002 | Monk |
| 6,441,503 B1 | 8/2002 | Webster |
| | (Continued) | | |

FOREIGN PATENT DOCUMENTS

| | | | |
|---|---|---|---|
| CN | 113483944 A | * 10/2021 | ............. G01L 19/06 |
| EP | 3135188 | 3/2017 | |
| WO | WO 10/102310 | 9/2010 | |

OTHER PUBLICATIONS

Fassbender et al., "Simulation and characterization of encapsulated pressure sensors," *Procedia Chemistry* I, 2009, pp. 843-846.

(Continued)

*Primary Examiner* — Peter J Macchiarolo
*Assistant Examiner* — Jermaine L Jenkins
(74) *Attorney, Agent, or Firm* — Brownstein Hyatt Farber Schreck, LLP

(57)     ABSTRACT

A sensor module includes a container. The container has a closed wall extending between a first end of the container and a second end of the container. An exterior of the closed wall at least partly defines a seal-receiving channel. The seal-receiving channel extends around a circumference of the closed wall. The sensor module also includes a pedestal positioned between the first end and the second end and at least partly defining a first compartment and a second compartment surrounded by the closed wall. The sensor module further includes a sensor die positioned within the first compartment and mounted on the pedestal.

18 Claims, 12 Drawing Sheets

(56) References Cited

U.S. PATENT DOCUMENTS

| | | | |
|---|---|---|---|
| 6,729,181 B2* | 5/2004 | Mayer | G01F 1/692 |
| | | | 73/204.22 |
| 6,882,535 B2* | 4/2005 | Labanok | H01L 23/36 |
| | | | 257/E23.101 |
| 7,305,888 B2 | 12/2007 | Walchli | |
| 7,409,876 B2 | 8/2008 | Ganapathi et al. | |
| 7,698,950 B2 | 4/2010 | Kraatz | |
| 8,157,730 B2 | 4/2012 | LeBoeuf et al. | |
| 8,546,895 B2* | 10/2013 | Cortese | B81B 7/0061 |
| | | | 257/415 |
| 8,840,561 B2 | 9/2014 | Lane et al. | |
| 8,922,380 B2 | 12/2014 | O'Connor | |
| 9,254,995 B2 | 2/2016 | Bolognia et al. | |
| 9,608,297 B2 | 3/2017 | van Lammeren et al. | |
| 9,737,657 B2 | 8/2017 | Miesel et al. | |
| 9,846,095 B2 | 12/2017 | Chiou et al. | |
| 9,952,110 B2 | 4/2018 | Beer et al. | |
| 10,371,591 B2 | 8/2019 | Wagner et al. | |
| 10,599,101 B2 | 3/2020 | Rothkopf | |
| 10,599,192 B2 | 3/2020 | Younes et al. | |
| 10,610,157 B2 | 4/2020 | Pandya et al. | |
| 10,622,270 B2 | 4/2020 | Cook et al. | |
| 10,646,121 B2 | 5/2020 | Narasimhan et al. | |
| 10,684,708 B2 | 6/2020 | Zimmerman et al. | |
| 10,720,534 B2 | 7/2020 | Tomita | |
| 10,757,491 B1 | 8/2020 | Jackson et al. | |
| 10,782,818 B2 | 9/2020 | Deng et al. | |
| 10,860,114 B1 | 12/2020 | Oommen et al. | |
| 10,866,683 B2 | 12/2020 | Gupta et al. | |
| 10,890,502 B2 | 1/2021 | Miyake et al. | |
| 10,948,372 B2 | 3/2021 | Arndt et al. | |
| 10,973,422 B2 | 4/2021 | Pantelopoulos et al. | |
| 11,089,419 B2 | 8/2021 | Niederberger | |
| 11,346,738 B2 | 5/2022 | Ogawa et al. | |
| 11,397,120 B2 | 7/2022 | Montgomery et al. | |
| 11,419,504 B2 | 8/2022 | Nielsen et al. | |
| 11,534,071 B2 | 12/2022 | Vule et al. | |
| 2006/0075821 A1 | 4/2006 | Otsuka et al. | |
| 2010/0246855 A1 | 9/2010 | Chen | |
| 2012/0042734 A1 | 2/2012 | Wade et al. | |
| 2015/0172827 A1 | 6/2015 | Sharpe et al. | |
| 2016/0058375 A1 | 3/2016 | Rothkopf | |
| 2017/0067790 A1 | 3/2017 | Takeuchi | |
| 2018/0148316 A1 | 5/2018 | Duqi et al. | |
| 2018/0282148 A1 | 10/2018 | Hayashi | |
| 2018/0313711 A1 | 11/2018 | Sixtensson et al. | |
| 2019/0150754 A1 | 5/2019 | Naik et al. | |
| 2019/0223736 A1 | 7/2019 | Wang et al. | |
| 2020/0037077 A1 | 1/2020 | Peterson et al. | |
| 2020/0163561 A1 | 5/2020 | Choe | |
| 2020/0356210 A1 | 11/2020 | Stone et al. | |
| 2020/0357715 A1 | 11/2020 | Vincent | |
| 2021/0030367 A1 | 2/2021 | Cho et al. | |
| 2021/0100513 A1 | 4/2021 | Bahmanyar et al. | |
| 2021/0167487 A1 | 6/2021 | Varma et al. | |
| 2021/0169417 A1 | 6/2021 | Burton | |
| 2021/0219852 A1 | 7/2021 | Colburn et al. | |
| 2021/0330261 A1 | 10/2021 | Jung et al. | |
| 2021/0353164 A1 | 11/2021 | Chegani et al. | |
| 2022/0009438 A1 | 1/2022 | Schaller et al. | |
| 2022/0087541 A1 | 3/2022 | Montgomery et al. | |
| 2022/0087551 A1 | 3/2022 | Montgomery et al. | |
| 2022/0087552 A1 | 3/2022 | Montgomery et al. | |
| 2022/0087553 A1 | 3/2022 | Han et al. | |
| 2022/0091569 A1 | 3/2022 | Montgomery et al. | |
| 2022/0349765 A1 | 11/2022 | Montgomery et al. | |
| 2024/0099595 A1 | 3/2024 | Han et al. | |

OTHER PUBLICATIONS

Kato et al., "Sensor Technology to Realize Continuous Blood Pressure Monitoring," *Omron Technics*, vol. 50.004EN, Mar. 2019 10 pages.

León et al., "Elastomer Encapsulated Pressure Sensor With Engineered Air Cavity for Force Sensing," *IEEE Sensors Journal*, vol. 19, No. 16, Aug. 15, 2019, pp. 6628-6643.

Mannsfeld et al., Highly sensitive flexible pressure sensors with microstructured rubber dielectric layers *Nature Materials*, vol. 9, Oct. 2010, pp. 859-864.

Tenzer et al., "Inexpensive and Easily Customized Tactile Array Sensors using MEMS Barometers Chips," IEEE 2012, 5 pages.

* cited by examiner

100

200

300

218    304    302        216

500

522    516    514    548      540    532        542    544

800

802 — DISPLAY

814

804 — PROCESSOR

806 — POWER SOURCE

808 — MEMORY

810 — SENSOR SYSTEM

812 — I/O MECHANISM

SENSOR MODULE HAVING AN INTERMEDIATE PEDESTAL ON WHICH ONE OR MORE DIE ARE MOUNTED

CROSS-REFERENCE TO RELATED APPLICATION

This application is a nonprovisional and claims priority under 35 U.S.C. § 119(e) to U.S. Provisional Patent Application No. 63/347,475, filed May 31, 2022, the contents of which are incorporated herein by reference as if fully disclosed herein.

FIELD

The described embodiments relate generally to devices (e.g., smartphones, tablet computers, or other devices) incorporating one or more modules and, more particularly, devices incorporating one or more sensor modules and/or waterproof modules having more than one semiconductor die mounted therein.

BACKGROUND

Sensor systems are included in many electronic devices, including electronic devices such as smartphones, computers (e.g., tablet computers or laptop computers), wearable electronic devices (e.g., electronic watches, health monitors, earpods, headsets, or eyewear), game controllers, or navigation systems (e.g., vehicle navigation systems or robot navigation systems). Sensor systems may variously sense, for example, the presence of objects, distances or proximities to objects, movements of objects (e.g., whether objects are moving, or the speed, acceleration, or direction of movement of objects), two-dimensional (2D) boundaries of objects, three-dimensional (3D) shapes of objects, qualities of objects (e.g., particulate matter concentration, air quality, or object density), pressures of environments or phenomena, temperatures of environments or objects, or sounds made by environments or objects. Sensor systems may also determine environment or object types (or make educated guesses of environment or object types based, for example, on pattern or parameter matching, machine learning, or artificial intelligence (AI)).

Given the wide range of sensor system applications, any new development in the configuration or operation of a sensor system can be useful. New developments that may be particularly useful are developments that reduce the cost, size, complexity, part count, or manufacture time of the sensor system; developments that improve the sensitivity or speed of sensor system operation; or developments that increase the number of use cases or applications for a sensor system.

SUMMARY

Embodiments of the systems, devices, methods, and apparatus described in the present disclosure are directed to modules that may be included in electronic devices. In some embodiments, the modules may be sensor modules and/or waterproof modules. The modules may include containers or sleeves having a set of surfaces (e.g., platforms or pedestals) on which semiconductor die (referred to herein as "die", but also commonly referred to as "dice") may be mounted. At least two of the die may be mounted at different locations along an axis of the module. In this manner, the die may be directly or effectively "stacked" along the axis. This may reduce the size, cost, or other parameter(s) of the module, and may enable the dies to benefit from particular advantages of the module, such as waterproofing aspects of the module's container.

In a first aspect, a sensor module may include a container. The container may have a closed wall extending between a first end of the container and a second end of the container. An exterior of the closed wall may at least partly define a seal-receiving channel. The seal-receiving channel may extend around a circumference of the closed wall. The sensor module may also include a pedestal positioned between the first end and the second end and at least partly defining a first compartment and a second compartment surrounded by the closed wall. The sensor module may further include a sensor die positioned within the first compartment and mounted on the pedestal.

In another aspect, a module may include a container having a first end and a second end, and a pedestal positioned within the container. The pedestal may define at least part of a first end of a first compartment, at least part of a first end of a second compartment, and at least part of a conduit extending from the first compartment to the second compartment. The first and second compartments may be disposed at least partly within the container. A first die may be positioned within the container and mounted on the pedestal, and a second die may be positioned within the container.

In another aspect of the disclosure, a module may include a sleeve having a first end and a second end and an exterior defining a snout sealing surface. A pedestal may be held within the sleeve. The pedestal may at least partly separate a first compartment surrounded by the sleeve from a second compartment surrounded by the sleeve. The module may also include a waterproof cover attached to the first end of the sleeve and defining at least part of the first compartment, and a set of two or more dies. Each die of the set of two or more dies may be positioned at least partly in the first compartment or the second compartment, at a different position along an axis of the sleeve.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
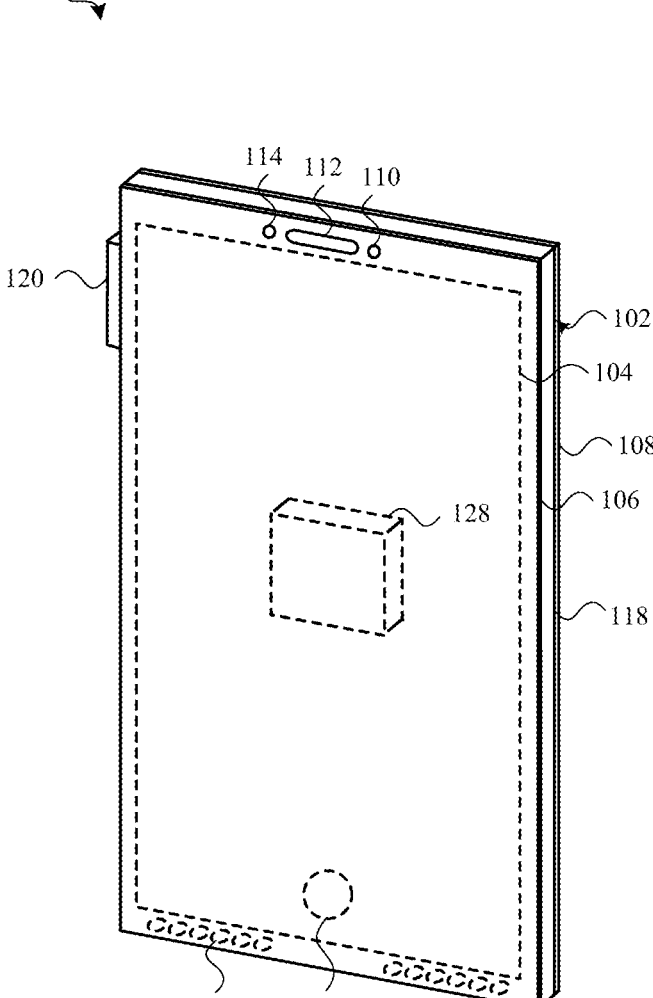
FIGS. 1A and 1B show an example of a device that may include one or more sensor modules.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Microelectromechanical system (MEMS) microphones and pressure sensors are included in many electronic devices (e.g., in smartphones, computers (e.g., tablet computers or laptop computers), or wearable electronic devices (e.g., electronic watches, health monitors, earpods, headsets, or eyewear). Both of these MEMS sensors typically need to be waterproofed (i.e., protected from water, but possibly exposed to air). Waterproofing these sensors increases their complexity (e.g., complexity of system assembly), cost, form factor, and risk of failure.

Described herein are techniques for integrating multiple dies within a single module. The module may include a sleeve that is subdivided into compartments by means of a pedestal. The pedestal may be mounted intermediate the ends of the sleeve, and one or more dies may be mounted to the same and/or opposite sides of the pedestal. An additional one or more dies may be mounted to a substrate attached to one end of the sleeve. In this manner, multiple dies may be positioned at different locations along an axis of the module and, in effect, the die may be directly or "effectively" stacked along the axis.

In some embodiments, the module may form a waterproof seal to a port or device in which the module is mounted. The waterproof seal may be facilitated by a snout sealing surface (or snout lid including a snout sealing surface), which snout sealing surface can receive, or be mated to, a seal such as an O-ring. The module itself, and the die mounted therein, may be waterproofed, at least in part, by means of a waterproof cover (e.g., a waterproof membrane) that forms part of the module.

In some embodiments, the pedestal may have a through-hole therein, or may have a through-hole that functions as part of a conduit, to enable air transfer between the module's different compartments (e.g., to enable movement of a diaphragm of a MEMS microphone, or to facilitate a MEMS pressure sensor's sensing of an ambient air pressure. The pedestal may also define a through-hole or notch that enables one or more wire bonds or flexible circuits to be routed between the module's different compartments.

The modules described herein enable two or more dies to be packaged together, which may reduce the overall form factor for providing the dies. The modules also enable one waterproofing process (e.g., one waterproof cover and snout sealing surface) to be used for more than one die, in a single package, which can reduce, for example, the complexity of system installation, cost, and risk of microphone failure due to particle contamination during system assembly.

These and other embodiments are described with reference to FIGS. 1A-8. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", or "right" is used with reference to the orientation of some of the components in some of the figures described below. Because components in various embodiments can be positioned in a number of different orientations, directional terminology is used for purposes of illustration only and is usually not limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

Figure 1B:
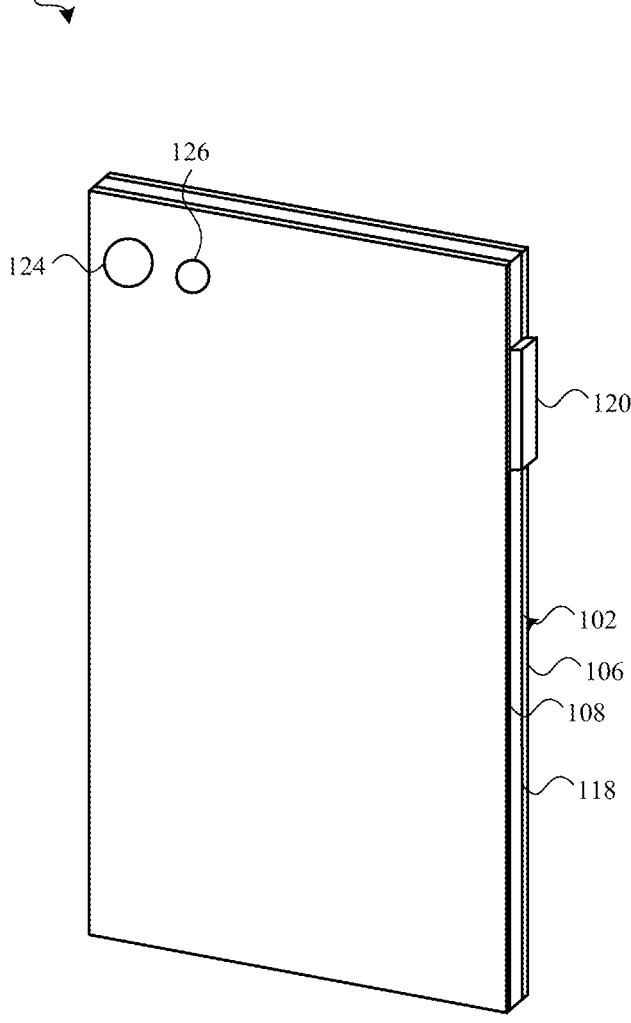

FIGS. 1A and 1B show an example of a device 100 that may include one or more sensor modules. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable music player, wearable device (e.g., an electronic watch, health monitoring device, fitness tracking device, earbud, headset, or eyewear), augmented reality (AR) device, virtual reality (VR) device, mixed reality (MR) device, gaming device, portable terminal, digital single-lens reflex (DSLR) camera, video camera, vehicle navigation system, robot navigation system, or other portable or mobile device. The device 100 could also be a device that is semi-permanently located (or installed) at a single location. FIG. 1A shows a front isometric view of the device 100, and FIG. 1B shows a rear isometric view of the device 100. The device 100 may include a housing 102 that at least partially surrounds a display 104. The housing 102 may include or support a front cover 106 or a rear cover 108. The front cover 106 may be positioned over the display 104 and may provide a window through which the display 104 may be viewed. In some embodiments, the display 104 may be attached to (or abut) the housing 102 and/or the front cover 106. In alternative embodiments of the device 100, the display 104 may not be included and/or the housing 102 may have an alternative configuration.

The display 104 may include one or more light-emitting elements, and in some cases may be a light-emitting diode (LED) display, an organic LED (OLED) display, a liquid crystal display (LCD), an electroluminescent (EL) display, or another type of display. In some embodiments, the display 104 may include, or be associated with, one or more touch and/or force sensors that are configured to detect a touch and/or a force applied to a surface of the front cover 106.

The various components of the housing 102 may be formed from the same or different materials. For example, a sidewall 118 of the housing 102 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are conductive or non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

In some cases, a force sensor (or part of a force sensor system) may be positioned within the interior volume above, below, and/or to the side of the display 104 (and in some cases within the device stack). The force sensor (or force sensor system) may be triggered in response to the touch sensor detecting one or more touches on the front cover 106

(or a location or locations of one or more touches on the front cover 106), and may determine an amount of force associated with each touch, or an amount of force associated with a collection of touches as a whole. In some embodiments, the force sensor (or force sensor system) may be used to determine a location of a touch, or a location of a touch in combination with an amount of force of the touch. In these latter embodiments, the device 100 may not include a separate touch sensor.

As shown primarily in FIG. 1A, the device 100 may include various other components. For example, the front of the device 100 may include one or more front-facing cameras 110 (including one or more image sensors), speakers 112, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. The device 100 may also include various input devices, including a mechanical or virtual button 116, which may be accessible from the front surface (or display surface) of the device 100.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122. For example, a microphone, ambient pressure sensor, ambient temperature sensor, internal/external differential pressure sensor, gas sensor, particulate matter concentration sensor, or air quality sensor may be positioned in or near a port 122.

In some embodiments, the rear surface of the device 100 may include a rear-facing camera 124 that includes one or more image sensors (see FIG. 1B). A flash or light source 126 may also be positioned on the rear of the device 100 (e.g., near the rear-facing camera). In some cases, the rear surface of the device 100 may include multiple rear-facing cameras.

Figure 2A:
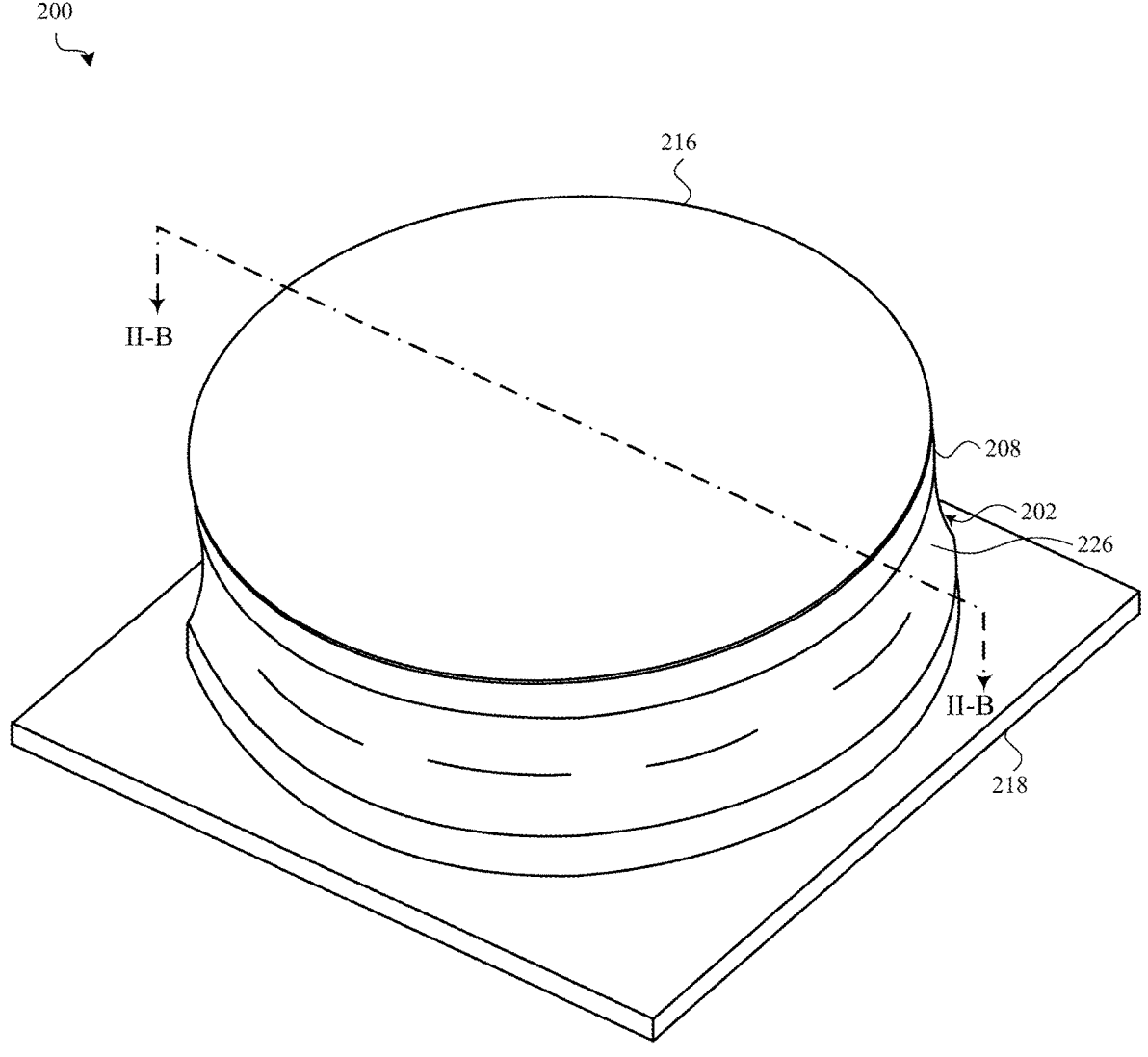
FIG. 2A shows an isometric view of a first example module.
Figure 2B:
FIG. 2B shows a cross-section of the module shown in FIG. 2A.
Figure 2B:
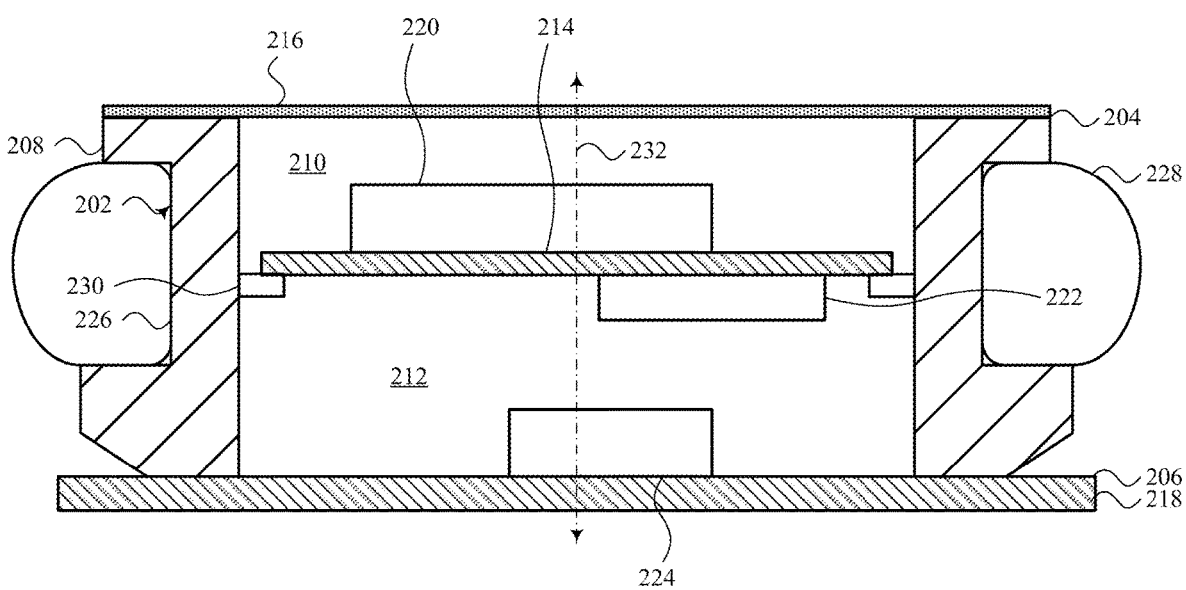

FIG. 2A shows an isometric view of a first example module 200, which in some embodiments may be a sensor module. FIG. 2B shows a cross-section of the module 200 (taken from viewpoint II-B-II-B in FIG. 2A). In some embodiments, the module 200 may be used in an electronic device such as the electronic device described with reference to FIGS. 1A and 1B. In some embodiments, the module 200 may be a sensor module including a microphone and a pressure sensor, and may be installed, for example, in or near one or more of the ports described with reference to FIG. 1B.

The module 200 may include a container 202. The container 202 may have a first end 204 and a second end 206, and in some embodiments may include a closed wall 208 (or sleeve having a first end and a second end) that extends between the first end 204 and the second end 206. The wall is "closed" in that it completely surrounds, and at least partially defines, a first compartment 210, and a second compartment 212. The closed wall 208 also surrounds a pedestal 214. In some embodiments, the closed wall 208 may include two or more wall components that are positioned adjacent one another about the circumference of the container 202 to define the closed wall 208. In some embodiments, the closed wall 208 may include two or more wall components that are stacked between the first end 204 and the second end 206.

The pedestal 214 may be positioned between the first and second ends 204, 206 of the container 202 and may partly define the first compartment 210 and the second compartment 212. For example, the pedestal 214 may define at least part of a first end of the first compartment 210 and at least part of a first end of the second compartment 212. In some embodiments, the pedestal 214 may be formed as part of a monolithic (e.g., molded or machined) structure including the closed wall 208. In other embodiments, the pedestal 214 may be attached (e.g., welded or adhesively bonded) to the closed wall 208 and/or the pedestal 214 may abut and/or be attached to one or more protrusions 230 (e.g., pegs, blocks, nubs, or a lip) that extend inward from the closed wall 208.

The container 202 may include a waterproof cover 216, such as a waterproof membrane (e.g., a waterproof breathable fabric that allows air, but not water, to pass through the fabric), that defines part or all of the first end 204 of the container 202. The waterproof cover 216 may be attached to an end of the closed wall 208 (or sleeve) and may define part or all of a second end of the first compartment 210.

The container 202 may also include a second cover 218 that defines part or all of the second end 206 of the container 202, as well as part or all of a second end of the second compartment 212. The second cover 218 may be attached to the closed wall 208 (or sleeve) at an end of the closed wall 208 that is opposite an end of the closed wall 208 to which the waterproof cover 216 is attached. In some embodiments, the second cover 218 may include a substrate that carries one or more conductors and/or one or more circuits (e.g., one or more dies carrying electrical, optical mechanical, electro-mechanical, or electrooptical circuits; discrete electrical components; etc.). In some embodiments, the second cover 218 may include more than one component, such as a substrate attached to closed wall 208, and a lid that covers a through-hole in the substrate. In some embodiments, the second cover 218 may be a waterproof cover.

The first and second compartments 210, 212 may be disposed entirely or partly within the container 202. That is, the first and second compartments 210, 212 may extend to no farther than the first and second ends 204, 206 of the container 202, or the first and second compartments 210, 212 may extend past the first and second ends 204, 206 and into one or more cavities defined by the waterproof cover 216 or the second cover 218.

A set of two or more dies may be mounted within the container 202, with each die positioned at least partly in the first compartment 210 or the second compartment 212, at a different position along an axis 232 of the closed wall or sleeve 208. In some embodiments, a first die 220 may be mounted to the pedestal 214. In some embodiments, a first die 220 may be mounted to a first side of the pedestal 214, and a second die 222 may be mounted to a second side of the pedestal 214. An additional one or more die may also or alternatively be mounted between the first die 220 and the pedestal 214 and/or between the second die 222 and the pedestal 214. An additional one or more die, such as die 224, may be mounted to the second cover 218. Some of the die (e.g., die 220) may extend into, or may be located in, the first compartment 210. Some of the die (e.g., die 222 and 224) may extend into, or may be located in, the second compartment 212. When more than one die 220, 222, 224 is mounted within the container 202, the die 220, 222, 224 may be connected in various ways; not connected; and/or connected to conductors that extend to outside of the container 202 for purposes of providing control signals to, or receiving data from, one or more of the die 220, 222, 224.

In some embodiments, one or more of the die 220, 222, 224 may be sensor die. In some embodiments, one of the die 220, 222, or 224 may be a sensor die including a MEMS microphone, and another one of the die 220, 222, or 224 may be a sensor die including a MEMS pressure sensor. In some embodiments, one of the die 220, 222, 224, or an additional die, may be a moisture sensor, a temperature sensor, a stress-sensitive device, or other type of sensor (and in particular, a sensor that requires exposure to the air, but not water, of an ambient environment.

In some embodiments, the pedestal 214 may define part or all of a conduit that extends from the first compartment 210 to the second compartment 212. For example, the pedestal 214 may have a through-hole that defines part or all of a conduit between the first compartment 210 and the second compartment 212. As another example, the pedestal 214 may have a notch that, together with an interior of the closed wall 208, defines part or all of a conduit between the first compartment 210 and the second compartment 212. In some embodiments, the pedestal 214 may define part or all of more than one conduit. The conduit(s) may be used, for example to allow air movement between the first and second compartments 210, 212, or to route conductors that electrically connect various die, or to route conductors that electrically connect one or more die to components outside the container 202.

An exterior of the closed wall 208 may partly or fully define a seal-receiving channel 226 or snout sealing surface (which snout sealing surface may be part of a channel or a surface that may be mated to a gasket or other form of seal). The seal-receiving channel 226 may extend around a circumference of the closed wall 208, and may receive a seal 228 (e.g., an O-ring or gasket). The seal-receiving channel 226, in combination with the seal 228, may enable the module 200 to be inserted into, and sealed within, a port such as one of the ports described with reference to FIGS. 1A and 1B. Air may move within the module 200 through the waterproof cover 216, but water may be prevented from entering both the container 202 and an electronic device containing the module 200.

In some embodiments, the container 202 may be formed of, or include, metal or plastic. The pedestal 214 may also be formed of, or include, metal or plastic. In some embodiments, the pedestal 214 may be formed by, or include, a printed circuit board (PCB), a molded interconnect device (MID), a ceramic substrate, a plastic substrate, or a flexible circuit substrate (e.g., a polyimide substrate). In some embodiments, in addition to one or more dies, the pedestal 214 may carry one or more conductors and/or discrete electrical components (e.g., resistors, capacitors, or inductors).

Figure 3:
FIG. 3 shows a plan view of a second example module.

By way of example, the module 200 has a generally cylindrical interior and circular exterior circumference. In other embodiments, a module including some or all of the components or features described with reference to FIGS. 2A and 2B may have an interior or exterior having a different shape or shapes. For example, FIG. 3 shows a plan view of a second example module 300. The module 300 has a square-shaped interior 302 and "rounded corner" square exterior circumferences 304. In other embodiments, a module may have a square-shaped interior and circular exterior circumferences, or any other combination of interior and exterior shapes.

Figure 4A:
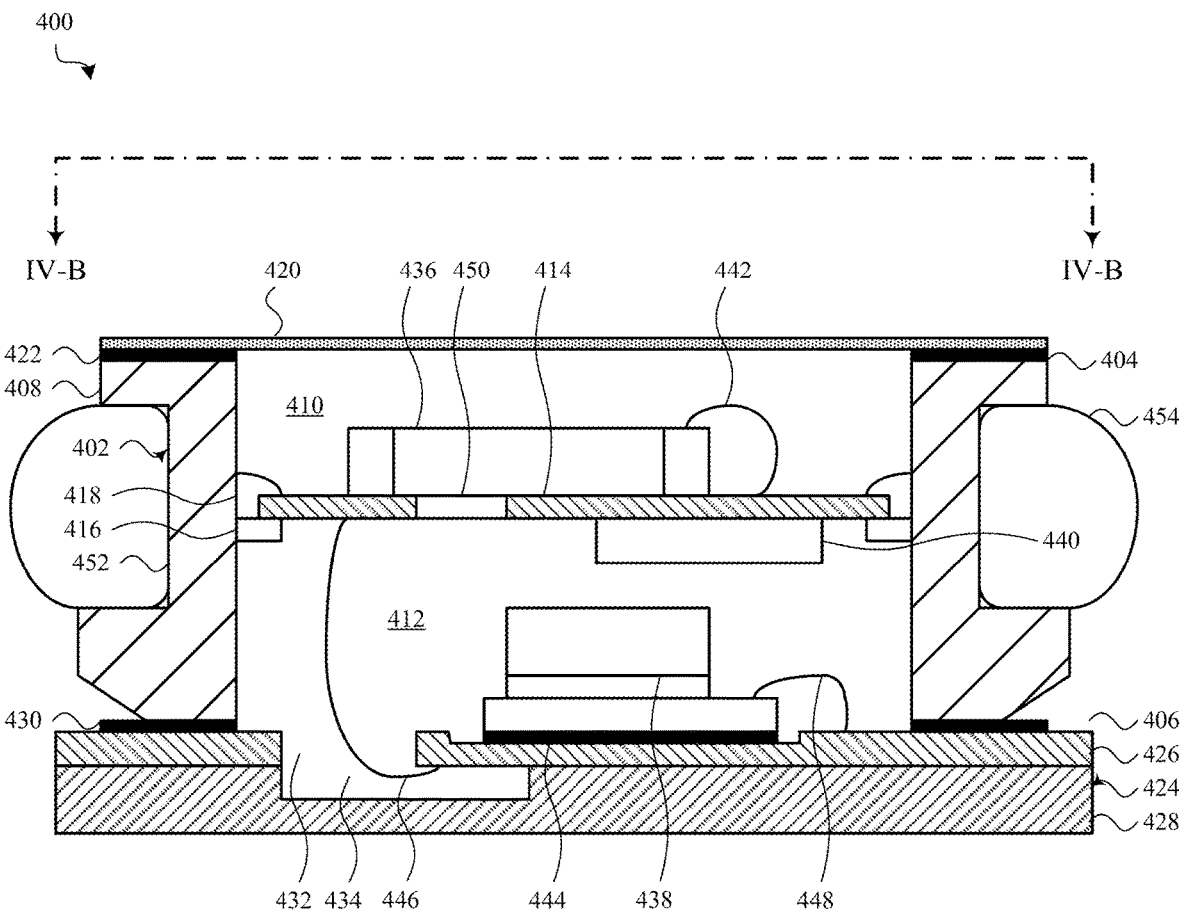
FIGS. 4A and 4B show a first example implementation of the module shown in FIG. 2A-2B or 3.
Figure 4B:

FIGS. 4A and 4B show a first example implementation of the module shown in FIG. 2A-2B or 3. By way of example, the module is a sensor module 400. FIG. 4A shows a cross-section of the sensor module 400, and FIG. 4B shows a plan view of the sensor module 400 (taken from viewpoint IV-B-IV-B in FIG. 4A). In some embodiments, the sensor module 400 may be used in an electronic device such as the electronic device described with reference to FIGS. 1A and 1B. In some embodiments, the sensor module 400 may be installed in or near one or more of the ports described with reference to FIG. 1B.

The sensor module 400 may include a container 402. The container 402 may have a first end 404 and a second end 406, and in some embodiments may include a closed wall 408 (or sleeve having a first end and a second end) that extends between the first end 404 and the second end 406. The closed wall 408 surrounds a first compartment 410, a second compartment 412, and a pedestal 414.

Figure 7:
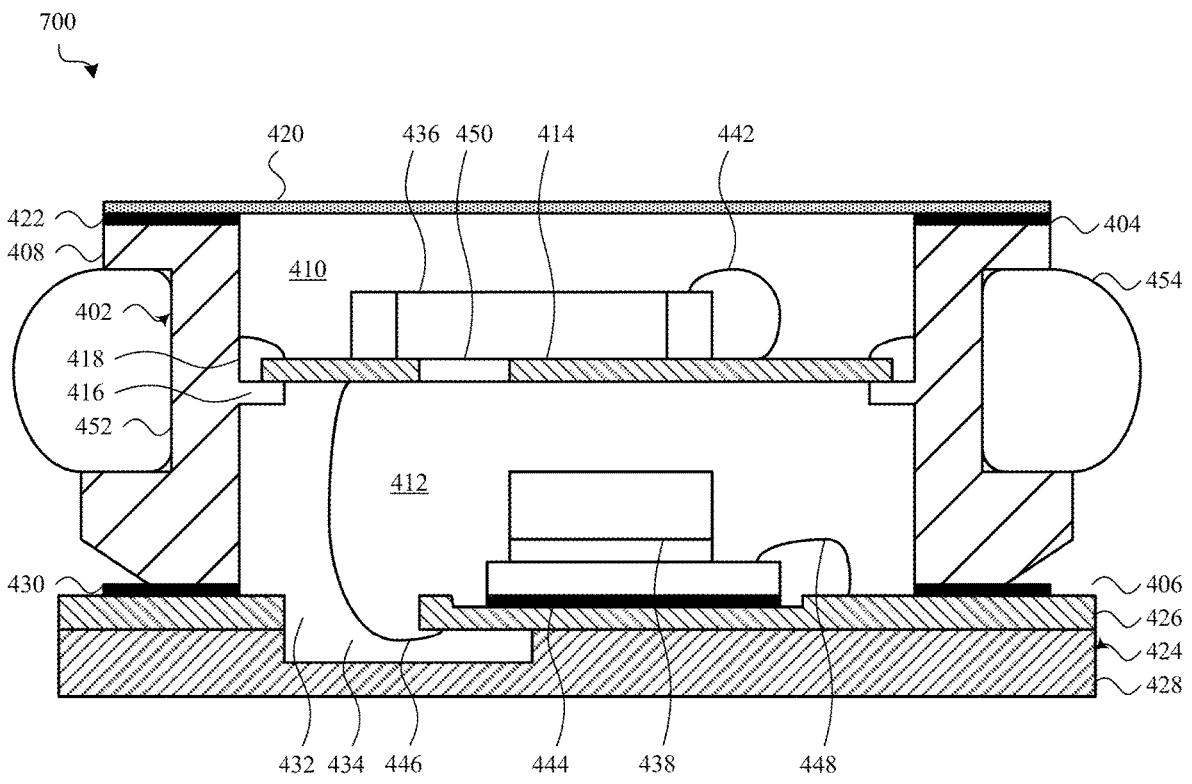
FIG. 7 shows a fourth example implementation of the module shown in FIG. 2A-2B or 3.

The pedestal 414 may be positioned between the first and second ends 404, 406 of the container 402, and may partly define the first compartment 410 and the second compartment 412. For example, the pedestal 414 may define at least part of a first end of the first compartment 410 and at least part of a first end of the second compartment 412. The pedestal 414 may abut one or more protrusions 416 (e.g., pegs, blocks, nubs, or a lip) that extend inward from the closed wall 408, and may be attached to the protrusion(s) 416 and/or interior surface of the closed wall 408 by means of one or more of an adhesive 418, weld, etc. The protrusions 416 may be features that are attached to an inner surface of the closed wall 408. Alternatively, the protrusions 416 may be part of a monolithic structure including the closed wall 408 (e.g., as shown in FIG. 7).

The container 402 may include a waterproof cover 420, such as a waterproof membrane (e.g., a waterproof breathable fabric), that defines part or all of the first end 404 of the container 402. The waterproof cover 420 may be attached to an end of the closed wall 408 (or sleeve) and may define part or all of a second end of the first compartment 410. By way of example, the waterproof cover 420 may be attached to an upper rim of the closed wall 408 using an adhesive 422.

The container 402 may also include a second cover 424 that defines part or all of the second end 406 of the container 402, as well as part or all of a second end of the second compartment 412. The second cover 424 may be attached to the closed wall 408 (or sleeve) at an end of the closed wall 408 that is opposite an end of the closed wall 408 to which the waterproof cover 420 is attached. In some embodiments, the second cover 424 may include a first substrate 426 and a second substrate 428. The first substrate 426 may be attached to a lower rim of the closed wall 408 (e.g., using an adhesive 430). The second substrate 428 may be attached to (e.g., stacked on) the first substrate 426 and function as a lid that covers a through-hole 432 in the first substrate 426. The second substrate 428 may define a cavity 434 that is at least partially aligned with the through-hole 432. In some embodiments, the second cover 424 may be a waterproof cover. By way of example, the first and second substrates 426, 428 may include a PCB, a MID, a ceramic substrate, a plastic substrate, or a flexible circuit substrate (e.g., a polyimide substrate).

A set of dies may be mounted within the container 402. A first die 436, which may be a first sensor die, may be mounted on a first side of the pedestal 414 and positioned within the first compartment 410. A second die 438, which may be a second sensor die, may be mounted on the first substrate 426 and positioned within the second compartment

412. In some embodiments, the first die 436 may include a MEMS microphone, and the second die 438 may include a MEMS pressure sensor.

A third die 440 may be mounted on a second side of the pedestal 414, such that the first and third dies 436, 440 are mounted on opposite sides of the pedestal 414. The third die 440 may be positioned within the second compartment 412. The third die 440 may include an application-specific integrated circuit (ASIC) that provides support functions for the first die 436. For example, the third die 440 may provide power and control signals to, and receive feedback and/or sensor data from, the first die 436. The first and third dies 436, 440 may be electrically connected in various ways, such as, using one or more conductors formed on the pedestal 414, wire bonds 442, conductive vias, a flexible circuit, etc.

A third die 440 may be mounted on a second side of the pedestal 414, such that the first and third dies 436, 440 are mounted on opposite sides of the pedestal 414. The third die 440 may be positioned within the second compartment 412. The third die 440 may include an application-specific integrated circuit (ASIC) that provides support functions for the first die 436. For example, the third die 440 may provide power and control signals to, and receive feedback and/or sensor data from, the first die 436. The first and third dies 436, 440 may be electrically connected in various ways, such as, using one or more of: conductors formed on the pedestal 414, wire bonds 442, conductive vias, a flexible circuit, solder, etc. In alternative embodiments, the third die 440 may be attached to the first side of the pedestal 414 and positioned between the first die 436 and the pedestal 414.

A fourth die 444 may be mounted on the first substrate 426, with the second die 438 stacked on and electrically coupled to the fourth die 444. The fourth die 444 may include an ASIC that provides support functions for the second die 438. For example, the fourth die 444 may provide power and control signals to, and receive feedback and/or sensor data from, the second die 438. The second and fourth dies 438, 444 may be electrically connected in various ways, such as, using one or more of: wire bonds, conductive vias, a flexible circuit, solder, etc.

Each of the third die 440 and the fourth die 444 may be electrically connected to conductors on the first or second substrate 426, 428, which conductors may be routed to circuitry outside the sensor module 400. The third and fourth dies 440, 444 may be electrically connected to the conductors on the first or second substrate 426, 428 using wire bonds 446, 448, a flexible circuit, or other forms of electrical connections. The through-hole 432 and cavity 434 may provide a path for the routing of one or more wire bonds 446 between the pedestal 414 or third die 440 and the backside of the first substrate 426, which backside may be easier for tools to reach before the second substrate 428 is attached to the first substrate 426. Alternatively, the wire bond 446 may be attached to the frontside of first substrate 426 (e.g., adjacent the fourth die 444).

In some embodiments, the pedestal 414 may define part or all of a conduit that extends from the first compartment 410 to the second compartment 412. For example, the pedestal 414 may have a through-hole 450 that defines part or all of the conduit, and a diaphragm of a MEMS microphone included in the first die 436 may be at least partially positioned over the through-hole 450 and at least partially aligned with the conduit. In this manner, air may move between the first and second compartments 410, 412, or the pressure of the air in the second compartment 412 may change, as sound waves travel through the waterproof cover 420 and are received on a surface of the diaphragm of the MEMS microphone. The conduit may also allow air movement through, or flexure of, the diaphragm of the MEMS microphone, which movement or flexure allows the MEMS pressure sensor to sense an air pressure outside the sensor module 400.

An exterior of the closed wall 408 may partly or fully define a seal-receiving channel 452 or snout sealing surface (which snout sealing surface may be part of a channel or a surface that may be mated to a gasket or other form of seal). The seal-receiving channel 452 may extend around a circumference of the closed wall 408, and may receive a seal 454 (e.g., an O-ring or gasket). The seal-receiving channel 452, in combination with the seal 454, may enable the sensor module 400 to be inserted into, and sealed within, a port such as one of the ports described with reference to FIGS. 1A and 1B. Air may move within the sensor module 400 through the waterproof cover 420, but water may be prevented from entering both the container 402 and an electronic device containing the sensor module 400.

In some embodiments, the container 402 may be formed of, or include, metal or plastic. The pedestal 414 may also be formed of, or include, metal or plastic. In some embodiments, the pedestal 414 may be formed by, or include, a PCB, a MID, a ceramic substrate, a plastic substrate, or a flexible circuit substrate.

Figure 5A:
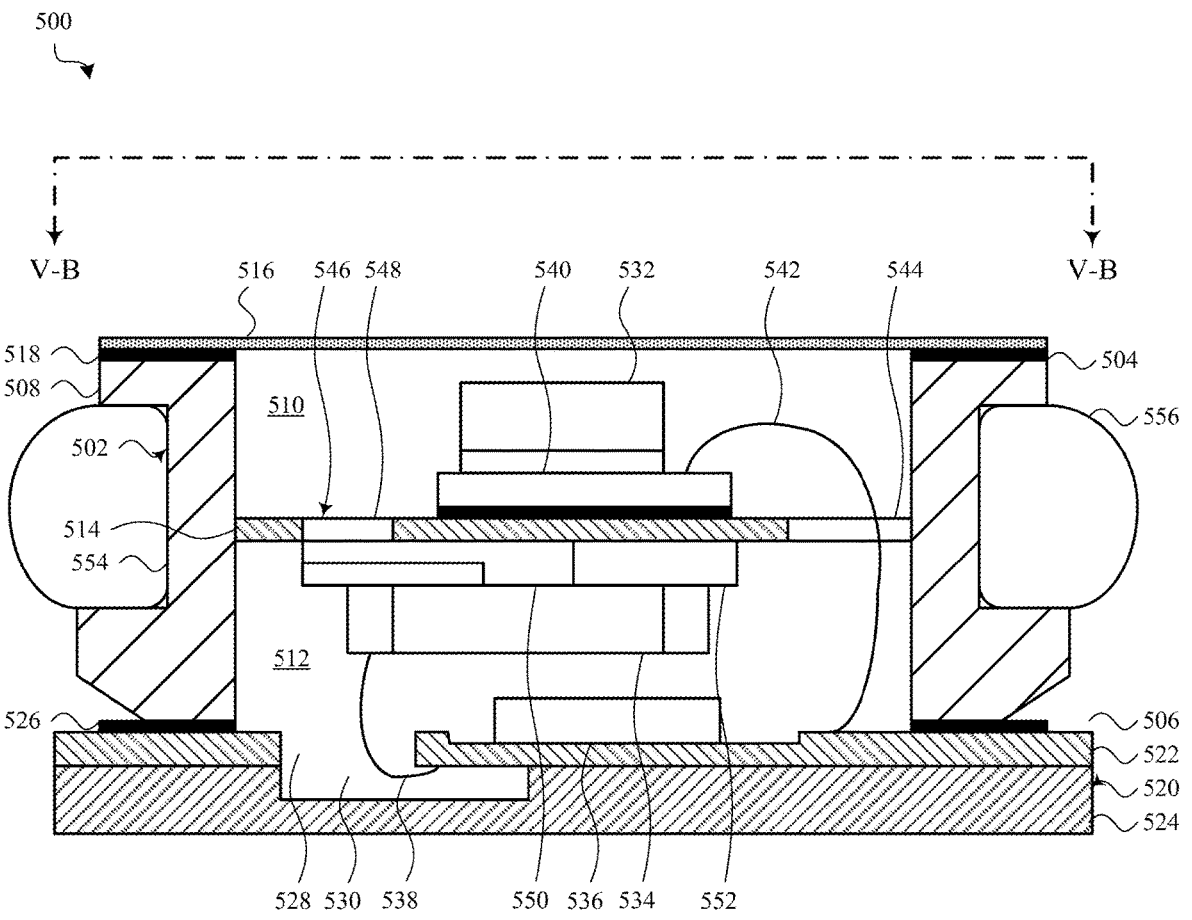
FIGS. 5A and 5B show a second example implementation of the module shown in FIG. 2A-2B or 3.
Figure 5B:

FIGS. 5A and 5B show a second example implementation of the module shown in FIG. 2A-2B or 3. By way of example, the module is a sensor module 500. FIG. 5A shows a cross-section of the sensor module 500, and FIG. 5B shows a plan view of the sensor module 500 (taken from viewpoint V-B-V-B in FIG. 5A). In some embodiments, the sensor module 500 may be used in an electronic device such as the electronic device described with reference to FIGS. 1A and 1B. In some embodiments, the sensor module 500 may be installed in or near one or more of the ports described with reference to FIG. 1B.

The sensor module 500 may include a container 502. The container 502 may have a first end 504 and a second end 506, and in some embodiments may include a closed wall 508 (or sleeve having a first end and a second end) that extends between the first end 504 and the second end 506. The closed wall 508 surrounds a first compartment 510, a second compartment 512, and a pedestal 514.

The pedestal 514 may be positioned between the first and second ends 504, 506 of the container 502, and may partly define the first compartment 510 and the second compartment 512. For example, the pedestal 514 may define at least part of a first end of the first compartment 510 and at least part of a first end of the second compartment 512. The pedestal 514 may be formed as part of a monolithic (e.g., molded or machined) structure including the closed wall 508.

The container 502 may include a waterproof cover 516, such as a waterproof membrane (e.g., a waterproof breathable fabric), that defines part or all of the first end 504 of the container 502. The waterproof cover 516 may be attached to an end of the closed wall 508 (or sleeve) and may define part or all of a second end of the first compartment 510. By way of example, the waterproof cover 516 may be attached to an upper rim of the closed wall 508 using an adhesive 518.

The container 502 may also include a second cover 520 that defines part or all of the second end 506 of the container 502, as well as part or all of a second end of the second compartment 512. The second cover 520 may be attached to the closed wall 508 (or sleeve) at an end of the closed wall 508 that is opposite an end of the closed wall 508 to which the waterproof cover 516 is attached. In some embodiments, the second cover 520 may include a first substrate 522 and a second substrate 524. The first substrate 522 may be attached to a lower rim of the closed wall 508 (e.g., using an adhesive 526). The second substrate 524 may be attached to (e.g., stacked on) the first substrate 522 and function as a lid that covers a through-hole 528 in the first substrate 522. The second substrate 524 may define a cavity 530 that is at least partially aligned with the through-hole 528. In some embodiments, the second cover 520 may be a waterproof cover. By way of example, the first and second substrates 522, 524 may include a PCB, a MID, a ceramic substrate, a plastic substrate, or a flexible circuit substrate (e.g., a polyimide substrate).

A set of dies may be mounted within the container 502. A first die 532, which may be a first sensor die, may be mounted on a first side of the pedestal 514 and positioned within the first compartment 510. A second die 534, which may be a second sensor die, may be mounted on a second side of the pedestal 514, such that the first and second dies 532, 534 are mounted on opposite sides of the pedestal 514. The second die 534 may be positioned within the second compartment 512. In some embodiments, the first die 532 may include a MEMS pressure sensor, and the second die 534 may include a MEMS microphone.

A third die 536 may be mounted on the first substrate 522 and positioned within the second compartment 512. The third die 536 may include an ASIC that provides support functions for the second die 534. For example, the third die 536 may provide power and control signals to, and receive feedback and/or sensor data from, the second die 534. The second and third dies 534, 536 may be electrically connected in various ways, such as, using wire bonds 538, conductive vias, a flexible circuit, etc. By way of example, a wire bond 538 is shown to electrically connect the second die 534 to the third die 536 by means of conductors (e.g., solder pads, conductive traces, and/or conductive vias) on the first substrate 522. The through-hole 528 and cavity 530 may provide a path for the routing of one or more wire bonds 538 between the second die 534 and the backside of the first substrate 522, which backside may be easier for tools to reach before the second substrate 524 is attached to the first substrate 522. Alternatively, the wire bond 538 may be attached to the frontside of the first substrate 522 (e.g., adjacent the third die 536).

A fourth die 540 may be mounted on the first side of the pedestal 514, with the first die 532 stacked on and electrically coupled to the fourth die 540. The fourth die 540 may include an ASIC that provides support functions for the first die 532. For example, the fourth die 540 may provide power and control signals to, and receive feedback and/or sensor data from, the first die 532. The first and fourth dies 532, 540 may be electrically connected in various ways, such as, using one or more of: wire bonds, conductive vias, a flexible circuit, solder, etc.

Each of the third die 536 and the fourth die 540 may be electrically connected to conductors on the first or second substrate 522, 524, which conductors may be routed to circuitry outside the sensor module 500. The fourth die 540 may be electrically connected to the conductors on the first or second substrate 522, 524 using one or more wire bonds 542, a flexible circuit, or other forms of electrical connections. The wire bond(s) 542 may extend through a conduit that is at least partially defined by a through-hole or a notch 544. The through-hole or notch 544 may be defined, at least in part, by the pedestal 514.

In some embodiments, the pedestal 514 may define part or all of a conduit 546 that extends from the first compartment 510 to the second compartment 512. The conduit 546 may have a first end 548 that opens into the first compartment 510, and a second end 550 that opens into the second compartment 512. The first end 548 may have a first axis; the second end 550 may have a second axis; and the second axis may be offset from the first axis. Thus, the conduit 546 need not provide a linear air movement path and can instead route air in two or three dimensions. In some embodiments, part of the conduit 546 may be defined by a spacer 552, with the spacer 552 defining at least part of the offset between the second axis of the second end 550 of the conduit 546 and the first axis of the first end 548 of the conduit 546. In other embodiments, the offset between the axes may be fully defined by the pedestal 514.

As shown in FIG. 5A, the spacer 552 may be positioned between the second die 534 and the pedestal 514, though it need not be. In embodiments in which the second die 534 includes a MEMS microphone, the second end 550 of the conduit 546 may be at least partially aligned with a diaphragm of the MEMS microphone, and the first end 548 of the conduit 546 may be offset from the second end 550 of the conduit 546 so that the first end 548 of the conduit 546 is offset from the footprints of the first and fourth dies 532, 540.

An exterior of the closed wall 508 may partly or fully define a seal-receiving channel 554 or snout sealing surface (which snout sealing surface may be part of a channel or a surface that may be mated to a gasket or other form of seal). The seal-receiving channel 554 may extend around a circumference of the closed wall 508, and may receive a seal 556 (e.g., an O-ring or gasket). The seal-receiving channel 554, in combination with the seal 556, may enable the sensor module 500 to be inserted into, and sealed within, a port such as one of the ports described with reference to FIGS. 1A and 1B. Air may move within the sensor module 500 through the waterproof cover 516, but water may be prevented from entering both the container 502 and an electronic device containing the sensor module 500.

In some embodiments, the container 502 may be formed of, or include, metal or plastic. The pedestal 514 may also be formed of, or include, metal or plastic.

Figure 6:
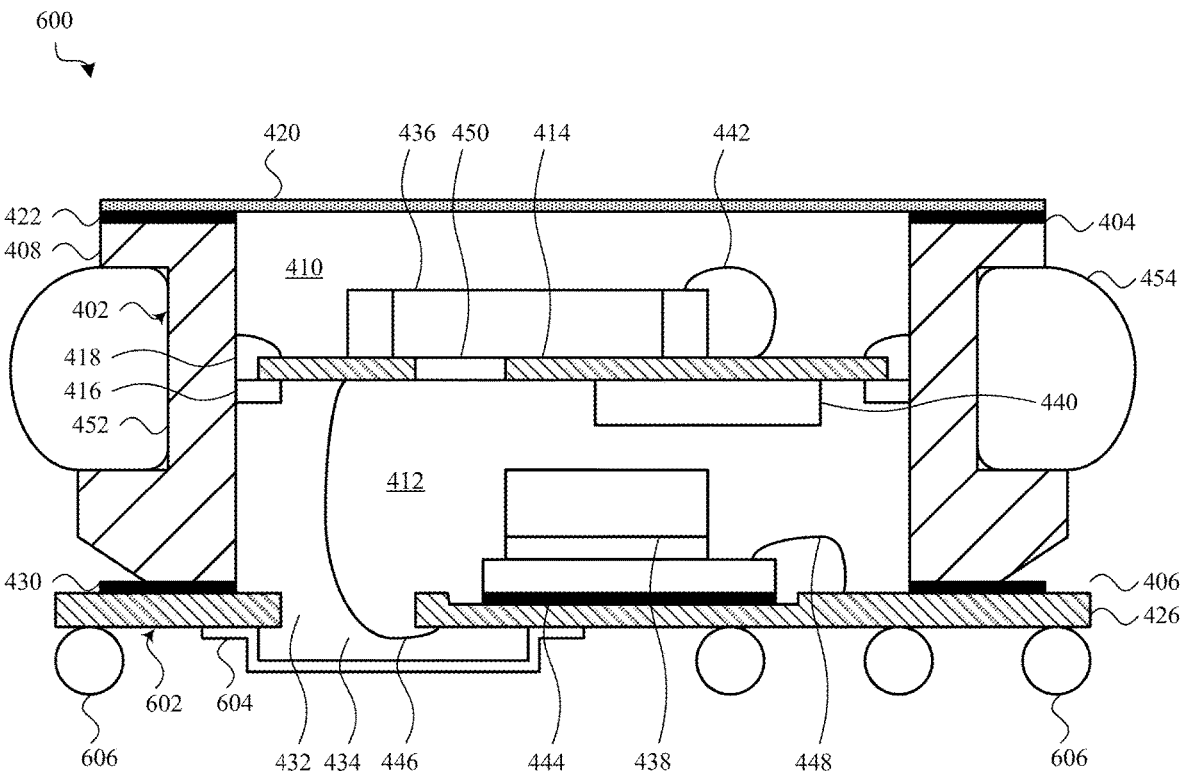
FIG. 6 shows a third example implementation of the module shown in FIG. 2A-2B or 3.

FIG. 6 shows a third example implementation of the module shown in FIG. 2A-2B or 3. By way of example, the module is a sensor module 600. FIG. 6 shows a cross-section of the sensor module 600. In some embodiments, the sensor module 600 may be used in an electronic device such as the electronic device described with reference to FIGS. 1A and 1B. In some embodiments, the sensor module 600 may be installed in or near one or more of the ports described with reference to FIG. 1B.

The sensor module 600 may be configured similarly to the sensor module described with reference to FIGS. 4A and 4B, and similar reference numerals are used to refer to similar components and features in FIGS. 4A-4B and 6. The sensor module 600 differs from the sensor module described with reference to FIGS. 4A and 4B in that its second cover 602 includes the first substrate 426 and a lid 604, instead of the first and second substrates 426, 428. Furthermore, the sensor module 600 includes an array of solder balls 606 (or alternatively, solder bumps, solder pads, or other surface-mounted electrical contacts/conductors). In some embodiments, and as shown, the solder balls 606 may have diameters (or heights) that are sufficiently large enough that, when the sensor module 600 is mounted to a carrier substrate or component via the solder balls 606, the solder balls 606 provide a module standoff that is sufficient to prevent the lid 604 from contacting the carrier substrate or component. In other embodiments, the lid 604 may be allowed to contact the carrier substrate or component, and in some cases may be grounded via its contact with the carrier substrate or component.

The sensor module 600 may be advantageous, in some applications, in that the second cover 602 only requires one substrate.

FIG. 7 shows a fourth example implementation of the module shown in FIG. 2A-2B or 3. By way of example, the module is a sensor module 700. FIG. 7 shows a cross-section of the sensor module 700. In some embodiments, the sensor module 700 may be used in an electronic device such as the electronic device described with reference to FIGS. 1A and 1B. In some embodiments, the sensor module 700 may be installed in or near one or more of the ports described with reference to FIG. 1B.

The sensor module 700 may be configured similarly to the sensor module described with reference to FIGS. 4A and 4B, and similar reference numerals are used to refer to similar components and features in FIGS. 4A-4B and 7. The sensor module 700 differs from the sensor module described with reference to FIGS. 4A and 4B in that it does not include the third die, and the fourth die 444 may additionally provide power and control signals to, and receive feedback and/or sensor data from, the first die 436.

The sensor module 700 may be advantageous, in some applications, in that it may perform the same functions as the sensor module described with reference to FIGS. 4A-4B, but with one less die.

Figure 8:
FIG. 8 shows an example electrical block diagram of an electronic device.
Figure 8:
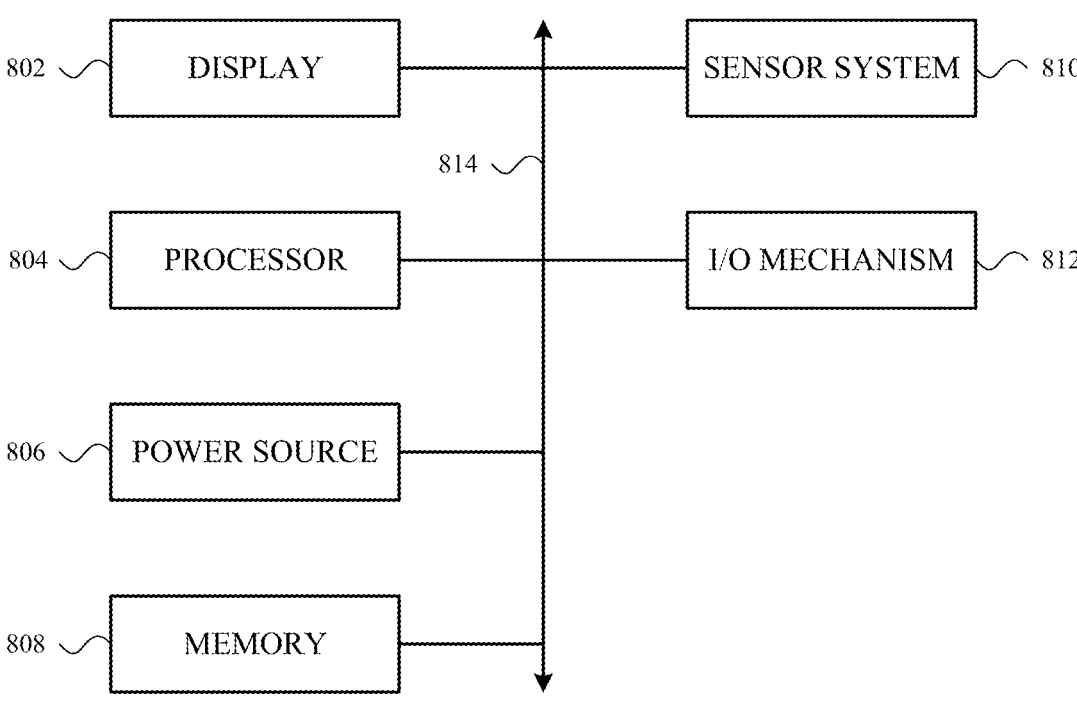

FIG. 8 shows a sample electrical block diagram of an electronic device 800, which electronic device may in some cases take the form of the device described with reference to FIGS. 1A and 1B and/or include a module as described with reference to FIGS. 1A-7. The electronic device 800 may include a display 802 (e.g., a light-emitting display), a processor 804, a power source 806, a memory 808 or storage device, a sensor system 810, or an input/output (I/O) mechanism 812 (e.g., an input/output device, input/output port, or haptic input/output interface). The processor 804 may control some or all of the operations of the electronic device 800. The processor 804 may communicate, either directly or indirectly, with some or all of the other components of the electronic device 800. For example, a system bus or other communication mechanism 814 can provide communication between the display 802, the processor 804, the power source 806, the memory 808, the sensor system 810, and the I/O mechanism 812.

The processor 804 may be implemented as any electronic device capable of processing, receiving, or transmitting data or instructions, whether such data or instructions is in the form of software or firmware or otherwise encoded. For example, the processor 804 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 800 can be controlled by multiple processors. For example, select components of the electronic device 800 (e.g., the sensor system 810) may be controlled by a first processor and other components of the electronic device 800 (e.g., the display 802) may be controlled by a second processor, where the first and second processors may or may not be in communication with each other.

The power source 806 can be implemented with any device capable of providing energy to the electronic device 800. For example, the power source 806 may include one or more batteries or rechargeable batteries. Additionally, or alternatively, the power source 806 may include a power connector or power cord that connects the electronic device 800 to another power source, such as a wall outlet.

The memory 808 may store electronic data that can be used by the electronic device 800. For example, the memory 808 may store electrical data or content such as, for example, audio and video files, documents and applications, device settings and user preferences, timing signals, control signals, and data structures or databases. The memory 808 may include any type of memory. By way of example only, the memory 808 may include random access memory, read-only memory, Flash memory, removable memory, other types of storage elements, or combinations of such memory types.

The electronic device 800 may also include one or more sensor systems 810 positioned almost anywhere on the electronic device 800. At least one of the sensor systems may rely on the sensors of a sensor module, as described herein. The sensor system(s) 810 may be configured to sense one or more type of parameters, such as but not limited to, sound; pressure; light; touch; force; heat; movement; relative motion; biometric data (e.g., biological parameters) of a user; etc. By way of example, the sensor system(s) 810 may include an audio sensor, a heat sensor, a position sensor, a light or optical sensor, an accelerometer, a pressure transducer, a gyroscope, a magnetometer, a health monitoring sensor, etc. Additionally, the one or more sensor systems 810 may utilize any suitable sensing technology, including, but not limited to, capacitive, ultrasonic, resistive, optical, ultrasound, piezoelectric, and thermal sensing technology.

The I/O mechanism 812 may transmit or receive data from a user or another electronic device. The I/O mechanism 812 may include the display 802, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally, or alternatively, the I/O mechanism 812 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A sensor module, comprising:
a container having a closed wall, the closed wall extending between a first end of the container and a second end of the container, an exterior of the closed wall at least partly defining a seal-receiving channel, the seal-receiving channel extending around a circumference of the closed wall;
a protrusion extending inward from an interior of the closed wall;
a pedestal positioned between the first end and the second end and at least partly defining a first compartment and a second compartment surrounded by the closed wall, the pedestal attached to the protrusion; and
a sensor die positioned within the first compartment and mounted on the pedestal.

2. The sensor module of claim 1, wherein:
the sensor die is a first sensor die; and
the sensor module further comprises a second sensor die positioned within the second compartment.

3. The sensor module of claim 2, wherein:
one of the first sensor die or the second sensor die includes a MEMS microphone; and
the other of the first sensor die or the second sensor die includes a MEMS pressure sensor.

4. The sensor module of claim 2, further comprising:
a waterproof membrane defining at least part of the first end of the container; and
a substrate defining at least part of the second end of the container.

5. The sensor module of claim 1, wherein the pedestal has a through-hole, the through-hole defining at least part of a conduit between the first compartment and the second compartment.

6. The sensor module of claim 1, wherein the pedestal comprises at least one of: a printed circuit board (PCB), a molded interconnect device (MID), a ceramic substrate, or a flexible circuit substrate.

7. A module, comprising:
a container having a first end and a second end;
a pedestal positioned within the container and defining,
at least part of a first end of a first compartment, the first compartment disposed at least partly within the container;
at least part of a first end of a second compartment, the second compartment disposed at least partly within the container; and
at least part of a conduit extending from the first compartment to the second compartment;
a first die positioned within the first compartment and mounted on the pedestal; and
a second die positioned within the second compartment.

8. The module of claim 7, further comprising:
a third die positioned within the container and mounted on the pedestal; wherein, the first die is mounted on a first side of the pedestal;
the third die is mounted on a second side of the pedestal and is positioned within the second compartment, the second side of the pedestal opposite the first side of the pedestal; and
the first die is electrically coupled to the third die.

9. The module of claim 8, wherein:
the container includes,
a waterproof cover defining,
at least part of the first end of the container; and
at least part of a second end of the first compartment;
a substrate defining,
at least part of the second end of the container; and
at least part of a second end of the second compartment; and
the second die is mounted on the substrate.

10. The module of claim 7, wherein:

the first die includes a MEMS microphone; and the conduit is aligned with a diaphragm of the MEMS microphone.

11. The module of claim 7, wherein:

the first die is mounted on a first side of the pedestal; 3 and the second die is mounted on a second side of the pedestal, the second side of the pedestal opposite the first side of the pedestal.

12. The module of claim 11, wherein:

the container includes a substrate defining, at least part of the second end of the container; and at least part of a second end of the second compartment; and the module further comprises:

a third die mounted on the substrate and positioned within the second compartment;

a fourth die mounted on the pedestal, between the first die and the pedestal, and positioned within the first compartment;

a first conductor, electrically coupled to the second die and the substrate; and a second conductor, electrically coupled to the fourth die and the substrate, the second conductor extending through the conduit.

13. The module of claim 11, wherein:

the conduit has a first end opening into the first compartment, the first end having a first axis;

the conduit has a second end opening into the second compartment, the second end having a second axis; and the second axis is offset from the first axis.

14. The module of claim 13, further comprising:

a spacer defining a second part of the conduit, the spacer defining at least part of the offset between the second axis of the second end of the conduit and the first axis of the first end of the conduit.

15. A module, comprising:

a sleeve having, a first end and a second end; and an exterior defining a snout sealing surface;

a pedestal held within the sleeve, the pedestal at least partly separating a first compartment surrounded by the sleeve from a second compartment surrounded by the sleeve;

a waterproof cover attached to the first end of the sleeve and defining at least part of the first compartment; and a set of two or more dies, each die of the set of two or more dies positioned at least partly in the first compartment or the second compartment, at a different position along an axis of the sleeve.

16. The module of claim 15, further comprising:

a second cover attached to the second end of the sleeve and defining at least part of the second compartment.

17. The module of claim 16, further comprising:

a wire bond; wherein, the second cover includes, a substrate attached to the second end of the sleeve, the substrate defining a through-hole; and a lid covering the through-hole and defining a cavity; and a portion of the wire bond extends into the cavity.

18. The module of claim 17, wherein:

at least a first die of the set of two or more dies is mounted to the pedestal; and at least a second die of the set of two or more dies is mounted to the substrate.

* * * * *